(12) United States Patent
Yang et al.

(10) Patent No.: US 7,158,070 B1
(45) Date of Patent: Jan. 2, 2007

(54) ANALOG-TO-DIGITAL CONVERTER CAPABLE OF PERFORMING SELF-TEST

(75) Inventors: Chao-Chi Yang, Hsin-Chu (TW); Chung-An Tang, Hsin-Chu Hsien (TW)

(73) Assignee: Elan Microelectronics Corporation, HsinChu (TW)

( * ) Notice: Subject to any disclaimer, the term of this patent is extended or adjusted under 35 U.S.C. 154(b) by 0 days.

(21) Appl. No.: 11/306,257

(22) Filed: Dec. 21, 2005

(51) Int. Cl.
*H03M 1/34* (2006.01)

(52) U.S. Cl. ...................................... 341/163; 341/155
(58) Field of Classification Search ................ 341/163, 341/155, 118, 120
See application file for complete search history.

(56) References Cited

U.S. PATENT DOCUMENTS

| | | | |
|---|---|---|---|
| 7,038,609 B1* | 5/2006 | Hurrell | 341/156 |
| 2003/0098808 A1* | 5/2003 | Hirai | 341/155 |
| 2006/0066464 A1* | 3/2006 | San et al. | 341/155 |

* cited by examiner

*Primary Examiner*—Rexford Barnie
*Assistant Examiner*—Joseph Lauture
(74) *Attorney, Agent, or Firm*—Winston Hsu (57) ABSTRACT

While transforming an analog input voltage into a digital signal including several bits, an analog-to-digital converter including a built-in self test (BIST) circuit is used for performing the transformation and compensating an offset error of the analog input voltage. The operations of the digital-to-analog converter include a self test mode and a normal mode. And each of the self test mode and the normal mode includes a sampling phase and a bit cycling phase.

7 Claims, 9 Drawing Sheets

ANALOG-TO-DIGITAL CONVERTER
CAPABLE OF PERFORMING SELF-TEST

BACKGROUND OF THE INVENTION

1. Field of the Invention

The present invention relates to an analog-to-digital converter, and more particularly discloses an analog-to-digital converter capable of performing self-test.

2. Description of the Prior Art

Non-ideal properties such as offset errors or nonlinear errors often exist in a conventional analog-to-digital converter. The non-ideal properties are caused by failure to match different elements in the converter, negative properties of the elements, and parasitic capacitors of the elements. For example, output signals of the sensing elements range from hundreds of microvolts ($\mu$V) to tens of millivolts(mV), if the offset errors of an analog-to-digital converter are greater than the range of the output signals, the corresponding digital signals cannot be retrieved successfully. Therefore, designing products with analog-to-digital converters is a difficult task.

Furthermore, in an analog-to-digital converter, a built-in self test (BIST) circuit is utilized to detect nonlinearity errors, the built-in self test circuit comprises a ramp generator which significantly increases the size of the BIST circuit and makes the test of nonlinearity errors a very slow process.

Figure 1:
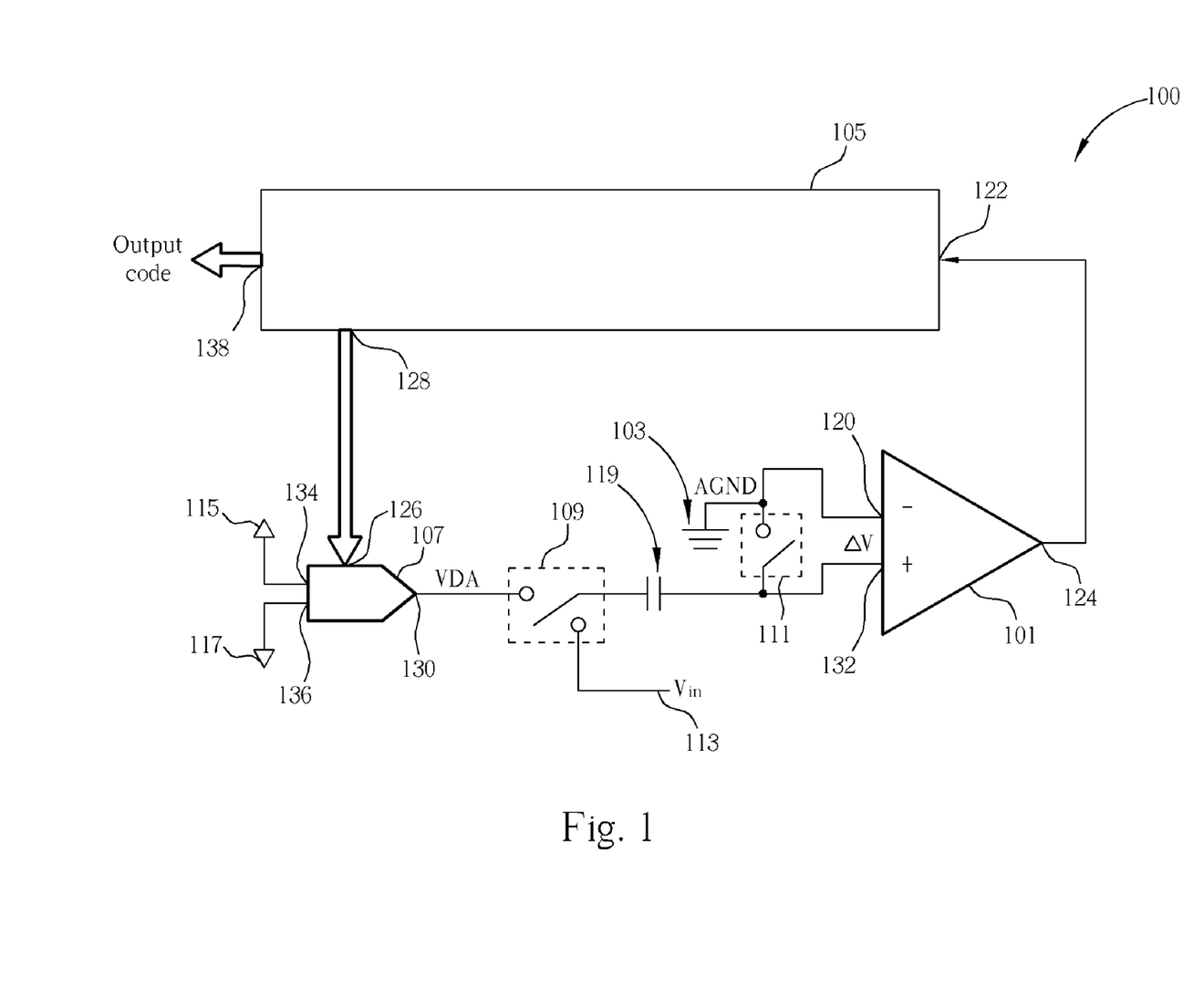
FIG. 1 is a diagram of a prior art analog-to-digital converter.

Please refer to FIG. 1, which is a diagram of a typical analog-to-digital converter 100. The analog-to-digital converter 100 comprises a comparator 101 having a first input 120 coupled to an analog ground source 103, a successive approximation register 105 having an input 122 coupled to an output 124 of the comparator 101, a digital-to-analog converter 107 having a first input 126 coupled to a first output 128 of the successive approximation register 105, a switch 109 coupled to an output 130 of the digital-to-analog converter 107 and a second input of the comparator 101, a switch 111 coupled to the first input 120 of the comparator 101, a second input 132 of the comparator 101, and the switch 109, an analog signal source 113 coupled to the switch 109, an upper-bound reference voltage source 115 coupled to a second input 134 of the digital-to-analog converter 107, and a lower-bound reference voltage source 117 coupled to a third input 136 of the digital-to-analog converter 107. A capacitor 119 parasitic to the digital-to-analog converter 107 equivalently exists between the switch 109 and the first input of the comparator 101.

A typical operation of the analog-to-digital converter 100 includes a sampling phase and a bit cycling phase. The sampling phase is responsible for sampling an analog input voltage at the second input 132 of the comparator 101, and the bit cycling phase is responsible for matching the output voltage at the output 130 of the digital-to-analog converter 107 with the analog input voltage at the analog signal source 113.

During the sampling phase of the analog-to-digital converter 100, the switch 111 is turned on so that the first input 120 of the comparator 101 is coupled to the analog-ground source 103, and the analog-ground source 103 is also coupled to the equivalent capacitor 119. In the meanwhile, the switch 109 is switched so that the analog signal source 113 is coupled to the equivalent capacitor 119, and the equivalent capacitor 119 is charged by the analog signal source 113 since the second input 132 of the comparator 101 is also coupled to the analog-ground source 103 at this time.

During the bit cycling phase, the switch 111 is turned off so that the analog-ground source 103 is disconnected from the second input 132 of the comparator 101 and the equivalent capacitor 119. In the meanwhile, the switch 109 is switched again so that the equivalent capacitor 119 is connected to the output 130 of the digital-to-analog converter 107. A recursive procedure, comprising outputting a first output voltage from the output 124 of the comparator 101 to the input 122 of the successive approximation register 105, outputting a control signal from the first output 128 of the successive approximation register 105 to the first input 126 of the digital-to-analog converter 107 according to the first output voltage, and outputting a second output voltage from the output 130 of the digital-to-analog converter 107 to the second input 132 of the comparator 101 across the equivalent capacitor 119 according to the control signal, is performed until the output voltage at the output 130 of the digital-to-analog converter 107 is converged to the analog input voltage at the analog signal source 113.

Assume that the input voltage at the analog input source 113 is Vin, the voltage of the analog-ground source is AGND, and the output voltage at the output 130 of the digital-to-analog converter 107 is VDA. Then, after the sampling phase is completed, the voltage difference of the equivalent capacitor 119 is Vin−AGND, and after the bit cycling phase is completed, the voltage difference of the equivalent capacitor 119 is VDA−(AGND+$\Delta$V), wherein $\Delta$V is a small voltage difference between the output voltage outputted from the output 130 of the digital-to-analog converter 107 and the analog input voltage at the analog signal source 113. Assume that the second output voltage is recursively converged to the analog input voltage at the analog signal source 113, according to the charge conservation law, an equation is listed below:

$$VDA-(AGND+\Delta V)=Vin-AGND \qquad (1)$$

Since the bit cycling phase is capable of reducing the value of $\Delta$V to zero, the value of VDA will become Vin, and the control signal outputted from the first output 128 of the successive approximation register 105 will become a digital value equivalent to the analog input voltage at the analog signal source 113. Further, this digital value will be outputted from the second output 138 of the successive approximation register 105.

Although the voltage difference $\Delta$V is able to be eliminated during the bit cycling phase, however, an offset error of the input voltage Vin is not thus compensated. In other words, if there is an offset in the input voltage Vin, equation (1) is not feasible any more.

SUMMARY OF THE INVENTION

An analog-to-digital converter comprises a successive-approximation register (SAR), a comparator coupled to a first input of the successive-approximation register at an output of the comparator; a first switch coupled to a first input of the comparator and an analog-ground source, a second switch coupled to a second input of the comparator and the analog-ground source, a first digital-to-analog converter having a first input coupled to a first output of the successive-approximation register, and a second input coupled to a second output of the successive-approximation register, a second digital-to-analog converter having an output coupled to the first input of the comparator, a third digital-to-analog converter having a first input coupled to the second output of the successive-approximation register, and a second input coupled to a third output of the successive-approximation register, a third switch coupled to a first reference voltage source, a first output of the first digital-to-analog converter, and a third input of the third digital-to-analog converter, a fourth switch coupled to a second reference voltage source, a second output of the first digital-to-analog converter, and a fourth input of the third digital-to-analog converter, a fifth switch coupled to an output of the third digital-to-analog converter, and the second input of the comparator, and a sixth switch coupled to the second output of the first digital-to-analog converter, the second reference voltage source, an analog input source, and the fifth switch.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an analog-to-digital converter capable of performing a built-in self test and capable of compensating offset errors. By compensating most of the offset errors, the remaining offset errors will be limited to an acceptable range, thus analog input signals can be converted to digital signals successfully. Furthermore, replacing the prior art ramp generator with a few control circuit will reduce the size of the chips.

Figure 2:
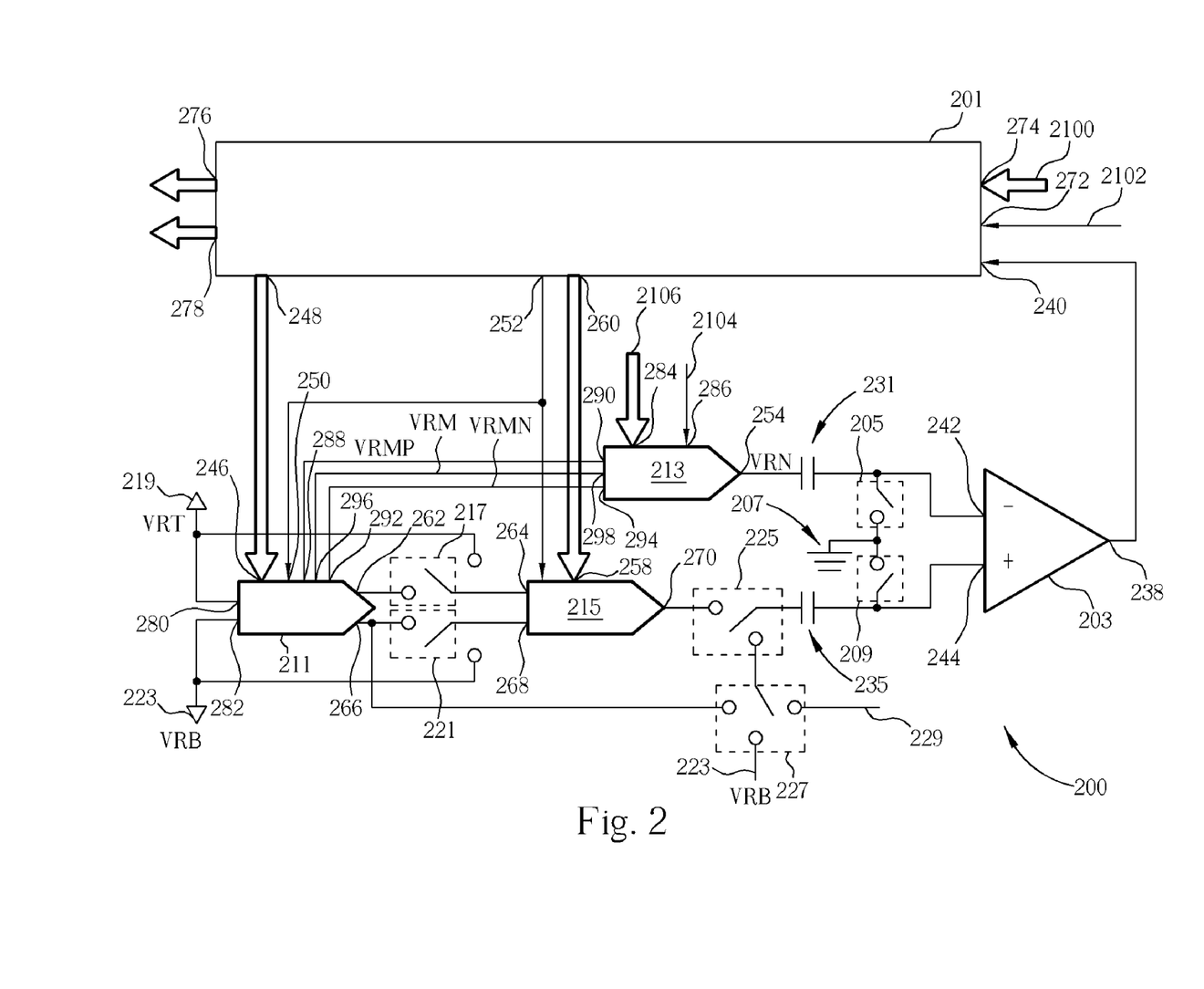
FIG. 2 is a diagram of an analog-to-digital converter capable of performing a built-in self test and capable of compensating offset errors according to the present invention.

Please refer to FIG. 2, which is a diagram of an analog-to-digital converter 200 of the present invention. The analog-to-digital converter 200 comprises a successive approximation register (SAR) 201 having some control logics, a comparator 203, a first digital-to-analog converter 211, a second digital-to-analog converter 213, a third digital-to-analog converter 215, a first switch 205, an analog ground source 207, a second switch 209, a third switch 217, a fourth switch 221, a fifth switch 225, a sixth switch 227, a first reference voltage source 219, a second reference voltage source 223, and an analog input source 229. The successive-approximation register 201 has a first input 240, a second input 272, a third input 274, a first output 248, a second output 252, a third output 260, a fourth output 276, and a fifth output 278. The comparator 203 has a first input 242, a second input 244, and an output 238. The first digital-to-analog converter 211 has a first input 246, a second input 250, a third input 280, a fourth input 282, a first output 262, a second output 266, a third output 288, a fourth output 292, and a fifth output 296. The second digital-to-analog converter 213 has a first input 284, a second input 286, a third input 290, a fourth input 294, a fifth input 298, and an output 254. The third digital-to-analog converter 215 has a first input 256, a second input 258, a third input 264, a fourth input 268, and an output 270.

An equivalent capacitor 231 parasitic to the second digital-to-analog converter 213 equivalently exists between the output 270 of the second digital-to-analog converter 213 and the second input 244 of the comparator 203. An equivalent capacitor 235 parasitic to the third digital-to-analog converter 215 equivalently exists between the fifth switch 225 and the second input 244 of the comparator 203.

The first input 240 of the successive-approximation register 201 is coupled to the output 238 of the comparator 203. The third input 274 of the successive approximation register 201 is coupled to a first control signal bus 2100. The second input 272 of the successive approximation register 201 is coupled to a second control signal bus 2102. The first output 248 of the successive approximation register 201 is coupled to the first input 246 of the first digital-to-analog converter 211. The second output 252 of the successive approximation register 201 is coupled to the second input 250 of the first digital-to-analog converter 211 and the first input 256 of the third digital-to-analog converter 215. The third output 260 of the successive approximation register 201 is coupled to the second input 258 of the third digital-to-analog converter 258. The fourth output 276 of the successive approximation register 201 is used to output a first half of an output digital signal of the successive approximation register 201. The fifth output 278 of the successive approximation register 201 is used to output a second half of the output digital signal of the successive approximation register 201.

The first input 242 of the comparator 203 is coupled to the first switch 205 and the output 254 of the second digital-to-analog converter 213. The second input of the comparator 203 is coupled to the second switch 209 and the fifth switch 225.

The third input 280 of the first digital-to-analog converter 211 is coupled to the first reference voltage source 219. The fourth input 282 of the first digital-to-analog converter 211 is coupled to the second reference voltage source 223. The first output 262 of the first digital-to-analog converter 211 is coupled to the third switch 217. The second output 266 is coupled to the fourth switch 221 and the sixth switch 227. The third output 288 of the first digital-to-analog converter 211 is coupled to the third input 290 of the second digital-to-analog converter 213. The fourth output 292 of the first digital-to-analog converter 211 is coupled to the fourth input 294 of the second digital-to-analog converter 213. The fifth output 296 of the first digital-to-analog converter 211 is coupled to the fifth input 298 of the second digital-to-analog converter 213. The fifth output 296 of the first digital-to-analog converter 211 is used to output an average voltage VRM of a voltage VRMP outputted by the third output 288 of the first digital-to-analog converter 211 and a voltage VRMN outputted by the fourth output 292 of the first digital-to-analog converter 211.

The first input 284 of the second digital-to-analog converter 213 is coupled to a third control signal bus 2106 which provides a digital signal for controlling the magnitude of an output voltage VRN outputted at the output 254 of the second digital-to-analog converter 213. The second input 286 of the second digital-to-analog converter 213 is coupled to a voltage source 2104 which inputs a voltage to determine the sign of the output voltage VRN outputted at the output 254 of the second digital-to-analog converter 213.

The output 270 is coupled to the fifth switch 225. The third input 264 of the third digital-to-analog converter 215 is coupled to the third switch 217. The fourth input 268 of the third digital-to-analog converter 215 is coupled to the fourth switch 221.

Both the first switch 205 and the second switch 209 are coupled to the analog ground source 207. The third switch 217 is coupled to the first reference voltage source 219. The fourth switch 221 is coupled to the second reference voltage source 223. The fifth switch 225 is coupled to the sixth switch 227. The sixth switch 227 is coupled to the analog input source 229 and the second reference voltage source 223.

The operations of the present invention digital-to-analog converter 200 include a self test mode and a normal mode. The self test mode is used to compensate offset errors of analog input voltages input from the analog input source 229, and is used to test accuracies of the output digital signals corresponding to the analog input voltages. The normal mode is used to transform an analog input voltage into a corresponding digital signal. Each of both the modes includes a sampling phase and a bit cycling phase. The sampling phase is used to sample an analog input voltage for the succeeding bit cycling phase. The bit cycling phase is used to derive a digital signal bit by bit during recursive steps. The recursive steps will generate a digital signal corresponding to the analog input voltage sampled in the sampling phase. The functions of the sampling phase and the bit cycling phase in the self test mode are slightly different with the sampling phase and the bit cycling phase in the normal mode. And the differences are explained later on.

Figure 3:
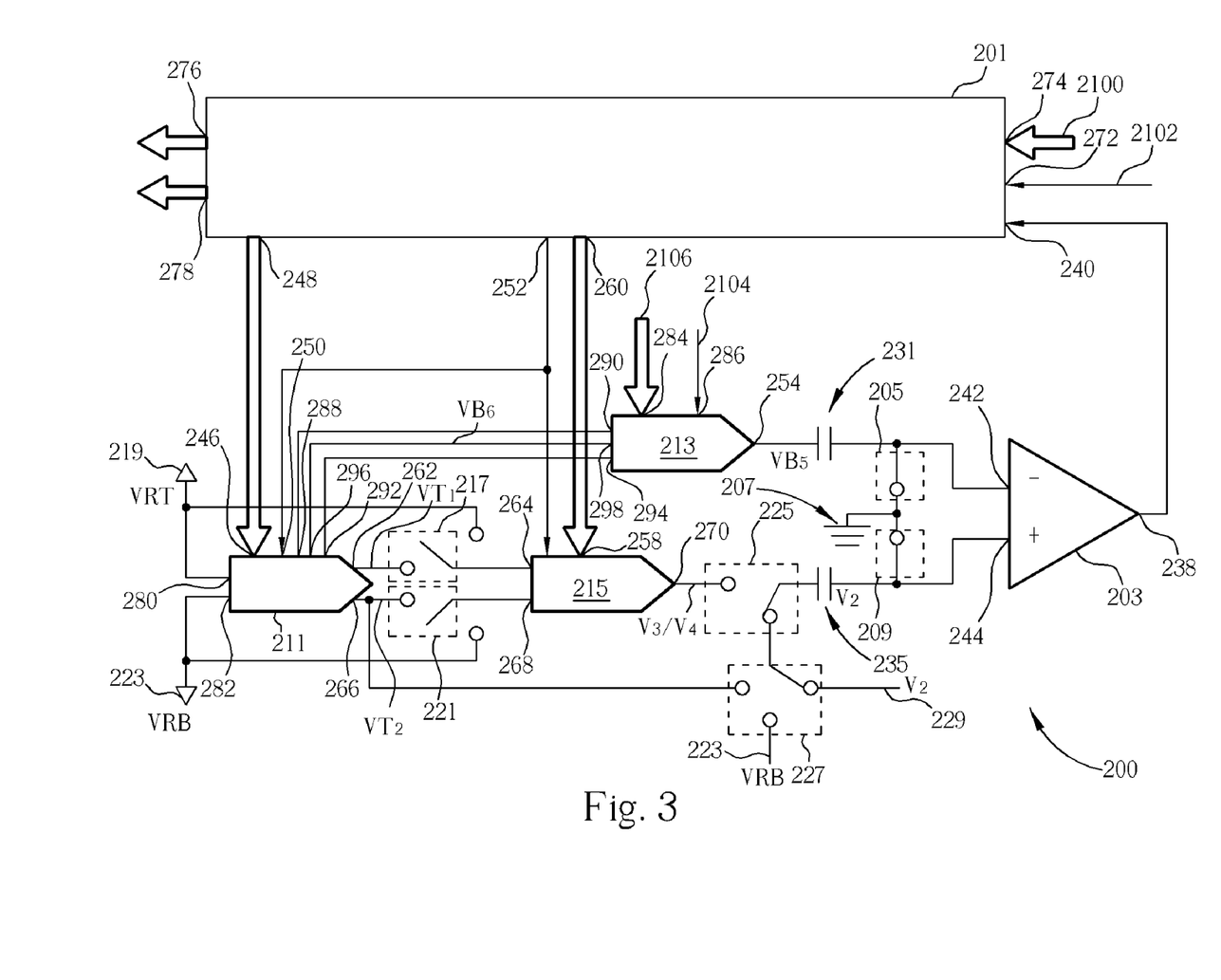
FIG. 3 is a diagram of the analog-to-digital converter in FIG. 2 performing the sampling phase of the normal mode.

Please refer to FIG. 3, which is a diagram of the analog-to-digital converter 200 in FIG. 2 performing the sampling phase of the normal mode. In FIG. 3, the third switch 217 and the fourth switch 221 are switched so that the first output 262 of the first digital-to-analog converter 211 is coupled to the third input 256 of the third digital-to-analog converter 215 and the second output 266 of the first digital-to-analog converter 211 is coupled to the fourth input 268 of the third digital-to-analog converter 215. The first switch 205 and the second switch 207 are also turned on so that the first input 242 of the comparator 203 is coupled to the analog-ground source 207, and the second input of the comparator 203 is coupled to the analog-ground source 207. The fifth switch 225 and the sixth switch 227 are both switched so that the analog input source 229 is coupled to the second input 244 of the comparator 203.

Figure 4:
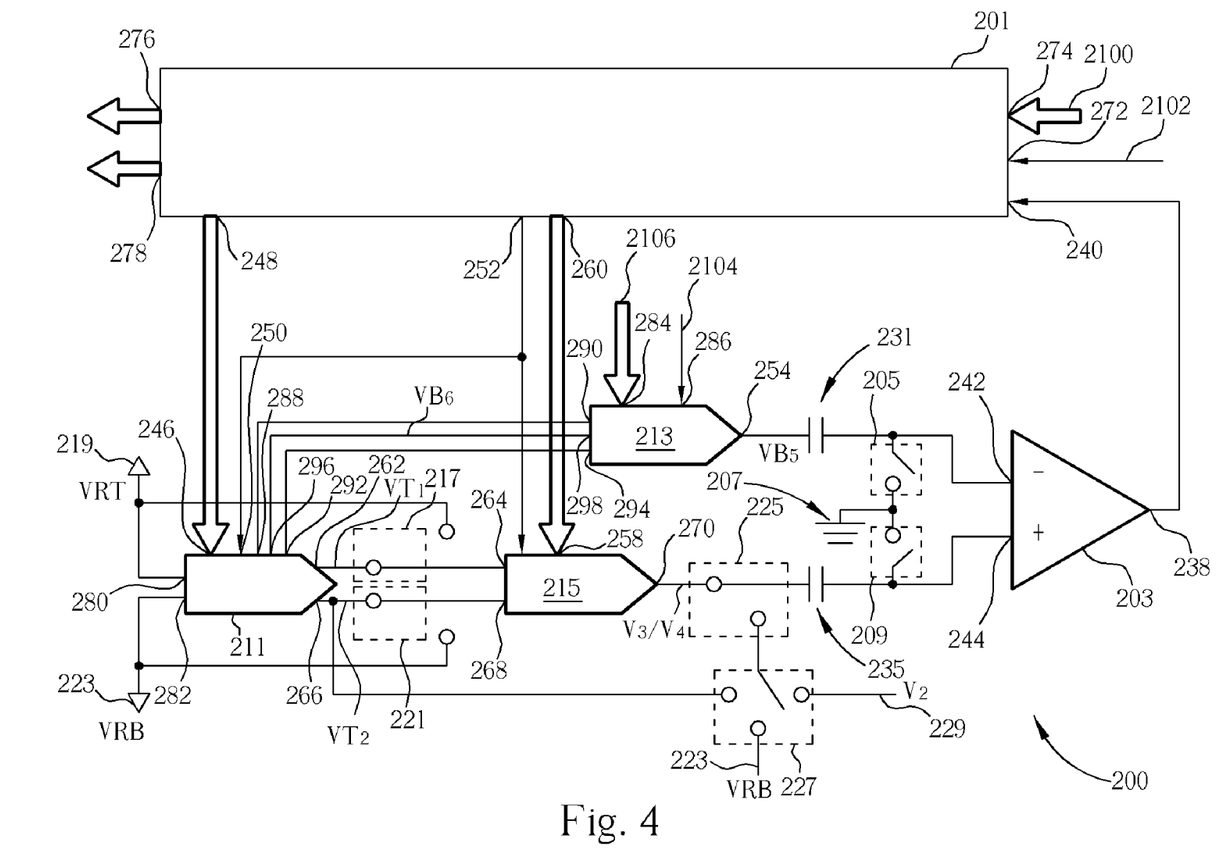
FIG. 4 is a diagram of the analog-to-digital converter in FIG. 2 performing the bit cycling phase of the normal mode.

Please refer to FIG. 4, which is a diagram of the analog-to-digital converter 200 in FIG. 2 performing the bit cycling phase of the normal mode. In FIG. 4, the status of the third switch 217 is kept as in FIG. 3 so that the first output 262 of the first digital-to-analog converter 211 is coupled to the third input 264 of the third digital-to-analog converter 215. The status of the fourth switch 221 is also kept as in FIG. 3 so that the second output 266 of the first digital-to-analog converter 211 is coupled to the fourth input 268 of the third digital-to-analog converter 215. The first switch 205 and the second switch 209 are both switched so that the analog-ground source 207 is disconnected from both inputs 242, 244 of the comparator 203 respectively. The fifth switch 225 is switched so that the analog input source 229 is disconnected from the second input 244 of the comparator 203, and the output 270 of the third digital-to-analog converter 215 is coupled to the second input 244 of the comparator 203.

The following introduction of the sampling phase and the bit cycling phase of the normal mode is based on the assumption that the processing mode of the successive approximation register 201 is ten bits at a time since the value of N is assumed to be 10.

The aim of the normal mode of the present invention analog-to-digital converter 200 is to receive a sampled voltage, and transform the sampled voltage into a 10-bit digital value.

In FIG. 3, during the sampling phase of the normal mode, an analog input voltage $V_2$ is inputted at the analog voltage source 229 and thus sampled by the equivalent capacitor 235 parasitic to the third digital-to-analog converter 215. The sampling phase of the normal mode is thus completed.

A fifth bias voltage $VB_5$ outputted at the output 254 of the second digital-to-analog converter 213 is used for recursive comparisons. The fifth bias voltage $VB_5$ is modulated by a sixth bias voltage $VB_6$ inputted at the fifth input 298 of the second digital-to-analog converter 213. The value of the sixth bias voltage $VB_6$ is $(VRT-VRB)/2$.

In FIG. 4, during the bit cycling phase of the normal mode, ten resulting bits corresponding to the analog input voltage $V_2$ sampled during the sampling phase of the normal mode are derived as the digital form of the sampled analog input voltage $V_2$. The ten resulting bits comprises a set of five former resulting bits and a set of five latter resulting bits. The processes of deriving both sets of five resulting bits are slightly different. While deriving the set of the five former resulting bits and following the well known equation $$Q=C*V \qquad (2),$$

where Q represents the electrical charge, C represents the capacitance, and V represents the voltage, by controlling the active statuses of the resistors of the first digital-to-analog converter 211, by fixing the active statuses of the capacitors of the third digital-to-analog converter 215, and by fixing the electrical charge stored by the third digital-to-analog converter 215, an analog voltage $V_3$ is generated at the output 270 of the third digital-to-analog converter 215 for performing the following comparisons. The active statuses of the resistors of the first digital-to-analog converter 211 are controlled by a set of control bits generated by the successive approximation register 201, outputted from the first output 248 of the successive approximation register 201, and inputted at the first input 246 of the first digital-to-analog converter 211. A first temporary voltage VT1 is thus generated at the first output 262 of the first digital-to-analog converter 211. And a second temporary voltage VT2 is generated at the second output 266 of the first digital-to-analog converter 211. Both the first temporary voltage VT1 and the second temporary voltage VT2 are generated for controlling the active statuses of the capacitors of the third digital-to-analog converter 215. Therefore, the analog voltage $V_3$ and the fifth bias voltage $VB_5$ are compared with each other recursively for deriving the five former resulting bits. The five former resulting bits are thus received by the successive approximation register 201 and outputted from the fourth output 276 of the successive approximation register 201. While deriving the five latter resulting bits and following equation (2), by changing the active statuses of the capacitors of the third digital-to-analog converter 215, and by fixing the electrical charge stored by the third digital-to-analog converter 215, an analog voltage $V_4$ is generated at the output 270 of the third digital-to-analog converter 215 for performing the following comparisons. Note that the value of the analog voltage $V_4$ is following the active statuses of the capacitors of the third digital-to-analog converter 215. And note that the value of the fifth bias voltage $VB_5$ has been decreased for comparisons of voltage units smaller than the voltage units used in deriving the five former resulting bits since the five former resulting bits represent larger units of the analog input voltage $V_2$. Therefore, the analog voltage $V_4$ and the fifth bias voltage $VB_5$ are compared recursively for deriving the five latter resulting bits. During the recursive comparisons, a set of bits used for compensating the offset error of the sampled analog input voltage is inputted from the third output 260 of the successive approximation register 201 bit by bit to the second input 258 of the third digital-to-analog converter 215, and is used to control active statuses of each specific capacitors of the third digital-to-analog converter 215 as well as to modulate the value of the analog voltage $V_4$ for the recursive comparisons. The five latter resulting bits are thus derived by the successive approximation register 201 and outputted at the fifth output 278 of the successive approximation register 201. The ten resulting bits, including the five former resulting bits outputted at the fourth output 276 of the successive approximation register 201 and the five latter resulting bits outputted at the fifth output 278 of the successive approximation register 201, are thus derived as a set of output bits of the present invention analog-to-digital converter 200.

In general, the value of N is not limited to 10. Note that if the analog-to-digital converter 200 is set to process N bits a time, the accuracies of the first digital-to-analog converter 211 and the comparator 203 are assured to be (N+1) least significant bits, and the accuracy of the third digital-to-analog converter 215 is assured to be N/2 least significant bits by the recursive comparisons mentioned above. As long as the accuracies of all the three elements are assured, the accuracy of the analog-to-digital converter 200 is also assured by the same restriction.

Figure 5:
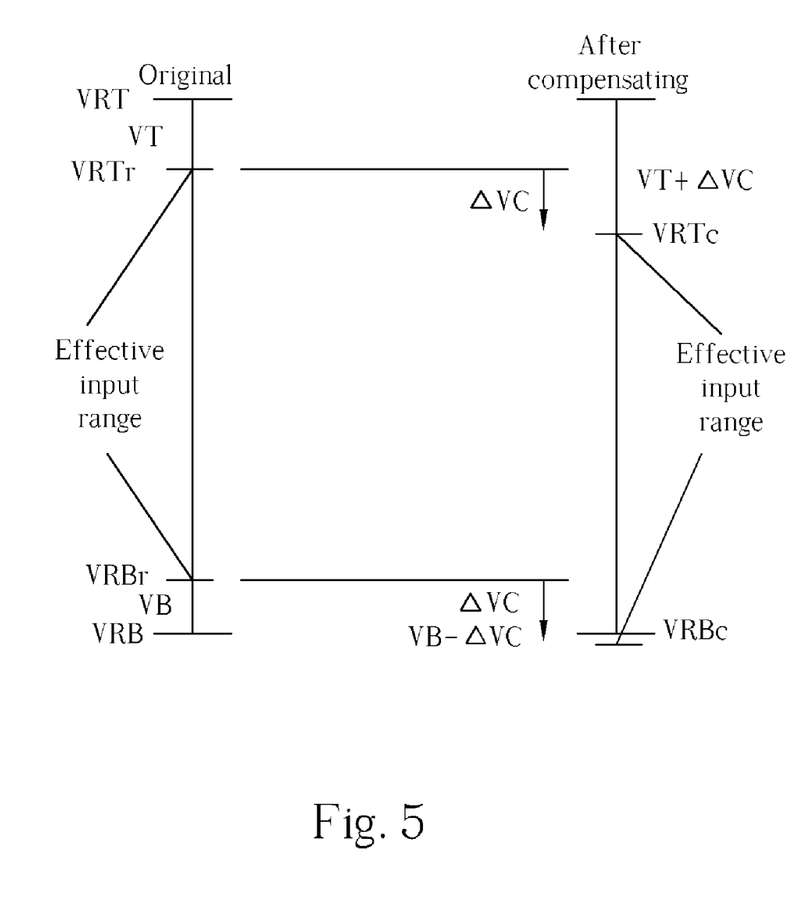
FIG. 5 is a comparative diagram of comparing the effects of not compensating the offset errors in the prior art analog-to-digital converter and of compensating the offset errors in the present invention analog-to-digital converter under the normal mode.

Please refer to FIG. 5, which is a comparative diagram of comparing the effects of not compensating the offset errors in the prior art analog-to-digital converter 100 and of compensating the offset errors in the present invention analog-to-digital converter 200 under the normal mode. Note that VRT is the value of the voltage at the upper-bound reference voltage source 115 or the first reference voltage source 219, and VRB is the value of the voltage at the lower-bound reference voltage source 117 or the second reference voltage source 223. In the prior art analog-to-digital converter 100, VRT and VRB are applied respectively as a top reference voltage and a bottom reference voltage, and are shown in the left side of FIG. 5. Considering non-ideal situations, effective input range of the analog input voltages is between VRTr and VRBr, since VRTr is corresponding to VRT, and VRBr is corresponding to VRB. Therefore, a top offset error of the prior art analog-to-digital converter 100 is VT, i.e. VRTr-VRT. A bottom offset error of the prior art analog-to-digital converter 100 is VB, i.e. VRBr-VRB. According to properties of the prior art analog-to-digital converter 100, a set of resulting bits of value 0 is retrieved while inputting an analog input voltage of value between VRB and VRBr or between VRTr and VRT. Therefore an actual corresponding digital code of the analog input voltage cannot be retrieved. As shown in FIG. 5, while inputting an analog input voltage $V_5$ of value VRTr at the analog input source 229 of the present invention analog-to-digital converter 200, the analog-to-digital converter 200 modulates the value of the analog input voltage $V_5$ from VRTr to VRTr-ΔVc and outputs a set of resulting bits corresponding to the modulated analog input voltage $V_5$. ΔVc is an offset voltage derived during the self test mode of the present invention analog-to-digital converter 200 and is used to compensate the offset error of the analog input voltage $V_5$ of value VRTr. While inputting a fifth analog input voltage of value VRBr in the present invention analog-to-digital converter 200, the analog-to-digital converter 200 modulates the value of the fifth analog input voltage from VRBr to VRBr-ΔVc and outputs a set of resulting bits corresponding to the modulated fifth analog input voltage wherein ΔVc is used for compensating the offset error of the fifth analog input voltage of value VRBr. The effective input range of the reference voltages after modulation is thus between VRTc and VRBc wherein VRTc is equivalent to VRTr-ΔVc and VRBc is equivalent to VRBr-ΔVc. Therefore a modulated top offset is equivalent to VRTc-VRT or -(VT+ΔVc), and a modulated bottom offset is equivalent to VRBc-VRB or VB-ΔVc. If ΔVc is equivalent to VB, the value of the modulated bottom offset is equivalent to 0 so that a set of resulting bits of an analog input voltage of value between VRB and VRBr can be retrieved, whereas the value of the modulated top offset is -(VT+VB). In other words, if ΔVc is equivalent to -VT, the value of the modulated top offset error can also be 0 whereas the value of the modulated bottom offset error is VT+VB. So either the value of the modulated top offset error or the value of the modulated bottom offset error can be chosen and be modulated to 0 according the requirement of the analog-to-digital converter 200.

Note that the value of the second reference voltage 223 can be various values other than VRB shown in FIG. 3 and FIG. 4 for meeting various requirements in accuracy during the normal mode.

Figure 6:
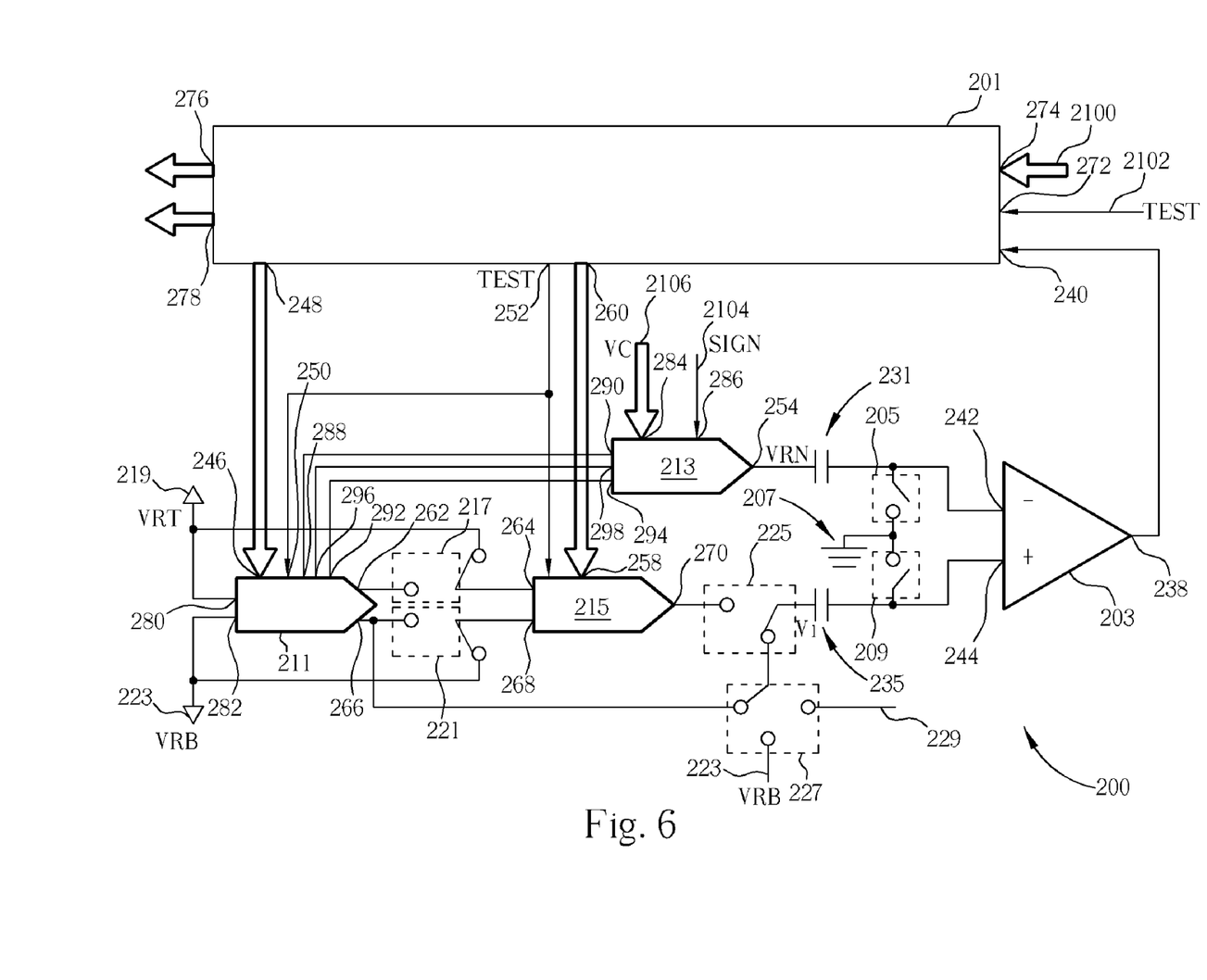
FIG. 6 is a diagram of an analog-to-digital converter in FIG. 2 performing the sampling phase of the self test mode.

Please refer to FIG. 6, which is a diagram of an analog-to-digital converter 200 in FIG. 2 performing the sampling phase of the self test mode. During the sampling phase of the self test mode, a test voltage TEST of the second control signal bus 2102 is inputted at the second input 272 of the successive approximation register 201. The third switch 217 is switched so that the first reference voltage source 219 is coupled to the third input 264 of the third digital-to-analog converter 215. The fourth switch 221 is switched so that the second reference voltage source 223 is coupled to the fourth input 268 of the third digital-to-analog converter 215. The fifth switch 225 and the sixth switch 227 are both switched so that the second output 266 of the first digital-to-analog converter 211 is coupled to the second input 244 of the comparator 203.

Figure 7:
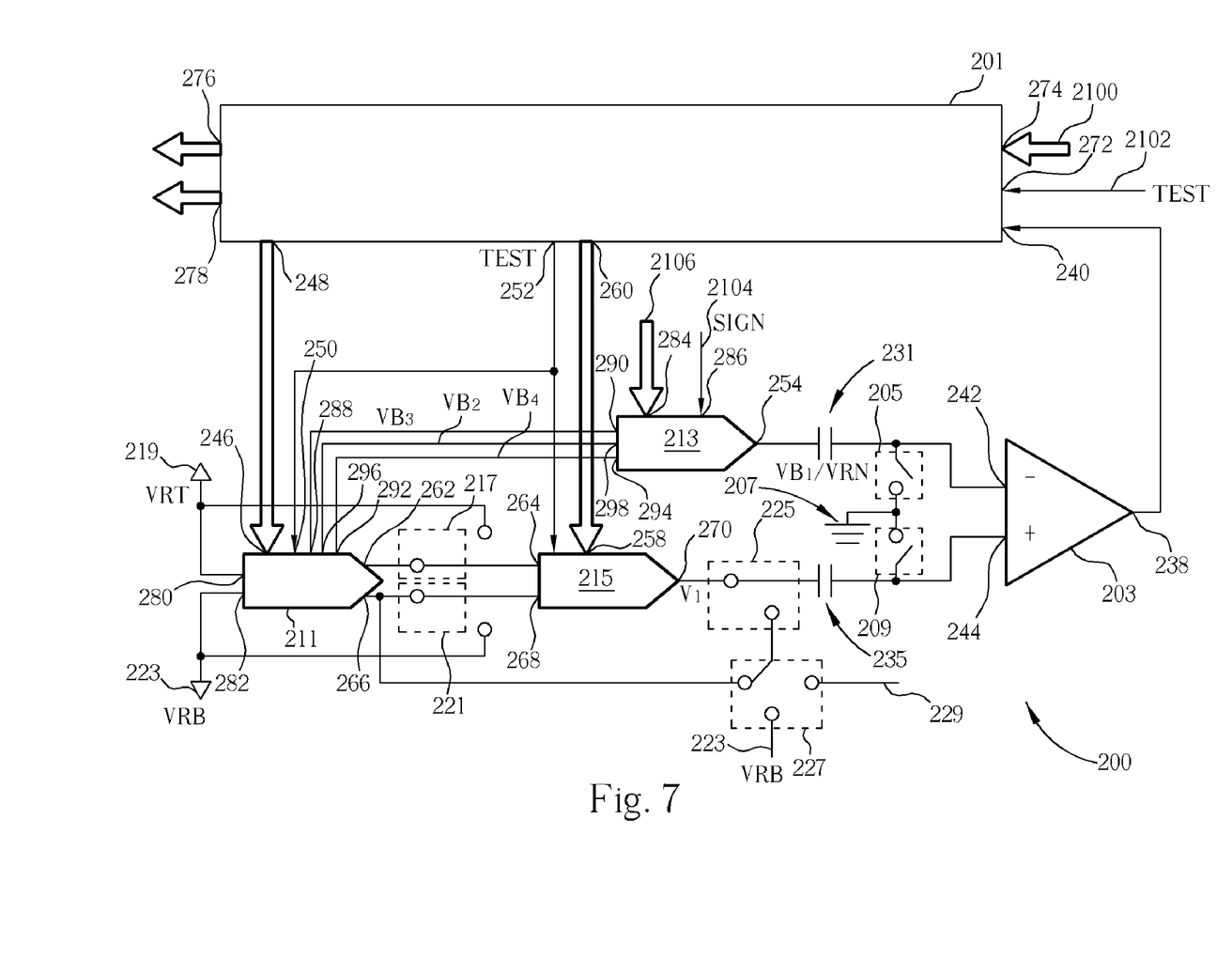
FIG. 7 is a diagram of the analog-to-digital converter in FIG. 2 performing the bit cycling phase of the self test mode.

Please refer to FIG. 7, which is a diagram of the analog-to-digital converter 200 in FIG. 2 performing the bit cycling phase of the self test mode. During the bit cycling phase of the self test mode, the first switch 205 and the second switch 209 are both switched so that the analog ground source 207 is disconnected from the first input 242 and the second input 244 of the comparator 203. The status of the third switch 217 is kept as in FIG. 6 so that the first output 262 of the first digital-to-analog converter 211 is coupled to the third input 264 of the third digital-to-analog converter 215. The status of the fourth switch 221 is kept as in FIG. 6 so that the second output 266 of the first digital-to-analog converter 211 is coupled to the fourth input 268 of the third digital-to-analog converter 215. The fifth switch 225 is switched again so that the output 270 of the third digital-to-analog converter 215 is coupled to the second input 244 of the comparator 203.

During the self test mode of the present invention analog-to-digital converter 200, several sets of bits are inputted at the third input 274 of the successive approximation register 201. Single set of bits is corresponding to single analog testing voltage. One set of bits representing an analog testing voltage is provided for testing accuracies of an outputted digital signal of the present invention analog-to-digital converter 200 and for compensating the offset error of the analog testing voltage.

In FIG. 6, during the sampling phase of the self test mode, a test voltage TEST is inputted at the second input 2102 of the successive approximation register 201 for alternating the processing mode of the successive approximation register 201 from N bits at once to N/2 bits at once. The successive approximation register 201 is assumed originally to process N bits at a time and N is a positive integer. One set of bits representing an analog testing voltage as mentioned above is then inputted from the first control signal bus 2100 and into the third input 274 of the successive approximation register 201. The operation of alternating the processing mode of the successive approximation register 201 from N bits at a time to N/2 bits at a time is designed for saving the complexity of the self test mode of the present invention analog-to-digital converter 200. N/2 bits are tested at a time to slightly increase the accuracy to less than double the original accuracy. The test voltage TEST is also outputted from the second output 252 of the successive approximation register 201, and inputted at both the first input 256 of the third digital-to-analog converter 215 and the second input 250 of the first digital-to-analog converter 211. Therefore both the processing mode of the first digital-to-analog converter 211 and the third digital-to-analog converter 215 are also alternated from N bits at a time to N/2 bits at a time. Assume the value of N is 10, and assume one set of N/2 bits, i.e. five bits, is inputted at the third input 274 of the successive approximation register 201. Then the set of the five bits is outputted at the first output 248 of the successive approximation register 201, and the set of the five bits is thus inputted at the first input 246 of the first digital-to-analog converter 211. The five bits are thus transformed into a first analog voltage $V_1$ with the first digital-to-analog converter 211. The first analog voltage $V_1$ is then outputted from the second output 266 of the first digital-to-analog converter 211 and stored by the equivalent capacitor 235 parasitic to the third digital-to-analog converter 235. The sampling phase of the self test mode is thus completed.

In FIG. 7, during the bit cycling phase of the self test mode, the above assumption that the set of the five bits is inputted at the third input 274 of the successive approximation register 201 is followed. Note that the first digital-to-analog converter 211 comprises a set of resistors whereas each of the second digital-to-analog converter 213 and the third digital-to-analog converter 215 comprises a set of capacitors. By equation (2), the electrical charge Q is fixed at the output of the first digital-to-analog converter 211 and is stored by the capacitors of the third digital-to-analog converter 215 during the sampling phase of the self test mode. Moreover, the first analog voltage $V_1$ stored by the equivalent capacitor 235 parasitic to the third digital-to-analog converter 215 can be modulated to be convergent to the analog form of the set of the five inputted bits with a rough error by controlling active status of the capacitors of the third digital-to-analog converter 215. Note that the fifth switch 225 is switched so that the second input 244 of the comparator 203 is coupled to the output 270 of the third digital-to-analog converter 215, the analog voltage $V_1$ can be viewed as being at the output 270 of the third digital-to-analog converter 215. A first bias voltage $VB_1$ at the output 254 of the second digital-to-analog converter 213 is initialized as a temporary unit. Recursive comparisons of the first bias voltage $VB_1$ and the first analog voltage $V_1$ are performed to derive five resulting bits at the successive approximation register 201. During the recursive comparisons, the values of both the first analog voltage $V_1$ and the first bias voltage $VB_1$ vary recursively. The five resulting bits are then compared with the set of the five inputted bits outputted from the first output 248 of the successive approximation register 201 for checking whether the five resulting bits and the set of five bits representing the first analog voltage $V_1$ are equivalent to each other. If they are equivalent to each other, the accuracy of the present invention analog-to-digital converter 200 is thus proved, and the five resulting bits are thus outputted at the fifth output 278 of the successive approximation register 201 as resulting digital bits during the self test mode of the present invention analog-to-digital converter 200. If they are not equivalent to each other, an offset error is recorded with respect to the set of five bits representing the first analog voltage $V_1$. The offset error is derived by a fine-tuning procedure including modulating a digital signal inputted at the first input 284 of the second digital-to-analog converter 213 for determining the magnitude of an output voltage VRN at the output 254 of the second digital-to-analog converter 213 and a sign voltage inputted at the second input of the second digital-to-analog converter 213 for determining the sign of the output voltage VRN at the output 254 of the second digital-to-analog converter 213. The difference of VRN and $V_1$ is thus the offset error to be recorded. Note that a second bias voltage $VB_2$ is outputted from the fifth output 296 of the first digital-to-analog converter 211 and inputted at the fifth input 298 of the second digital-to-analog converter 213. The value of the second bias voltage $VB_2$ is set to be $(VRT-VRB)/2$. VRT is the voltage inputted at the first reference voltage source 219 and VRB is the voltage inputted at the second reference voltage source 223. Also note that the second bias voltage $VB_2$ is also a mean of a third bias voltage $VB_3$ and a fourth bias voltage $VB_4$. The third bias voltage $VB_3$ is outputted at the third output 288 of the first digital-to-analog converter 211 and is inputted at the third input 290 of the second digital-to-analog converter 213. The fourth bias voltage $VB_4$ is outputted at the fourth output 292 of the first digital-to-analog converter 211 and is inputted at the fourth input 294 of the second digital-to-analog converter 213. The fine-tuning procedure is performed by modulating the second bias voltage $VB_2$, the third bias voltage $VB_3$, and the fourth bias voltage $VB_4$ and by modulating both a digital signal VC of the third control signal bus 2106 and a sign voltage SIGN of the voltage source 2104. An offset error corresponding to the first analog voltage $V_1$ is therefore derived during the fine-tuning procedure. At last, a plurality of offset errors corresponding to possible analog voltages are derived during such fine-tuning procedures and recorded.

Figure 8:
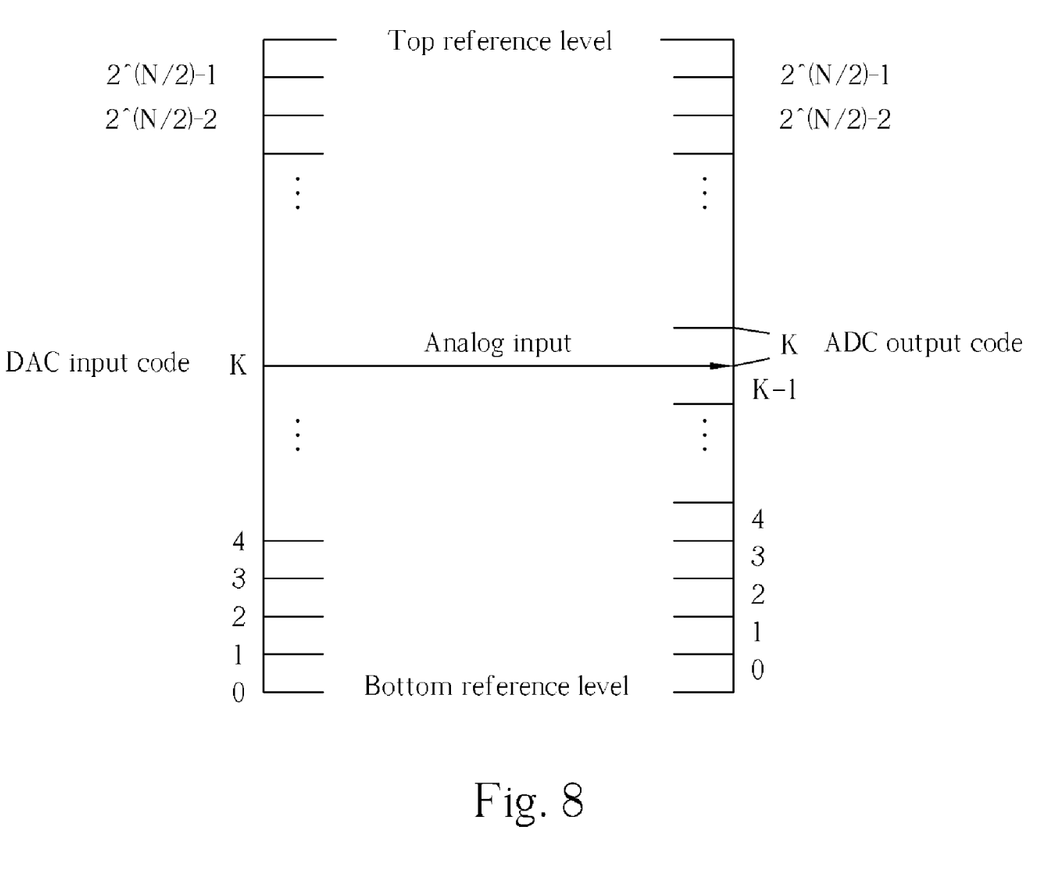
FIG. 8 is a diagram showing the effect of transforming an analog input voltage into a digital signal under the self test mode of the present invention analog-to-digital converter and under an ideal situation.

Please refer to FIG. 8, which is a diagram showing the effect of transforming an analog input voltage into a digital signal under the self test mode of the present invention analog-to-digital converter 200 and under an ideal situation. During the self test mode, a digital-to-analog converter block comprising N bits is split into a first DA (Digital-to-Analog) block comprising N/2 bits and a second DA block comprising N/2 bits inputted at the third input 260 of the successive approximation register 201 during the self test mode wherein N is a positive integer. Therefore an analog input voltage transformed from the second block ranges from 0 to $2^{N/2}-1$. As shown in FIG. 8, assume a value of a sixth analog input voltage transformed from a second DA block is K wherein K is a positive integer, therefore under an ideal situation, the sixth analog input voltage is transformed into a digital signal being exactly equivalent to K. In other words, the sixth analog input voltage is transformed into a critical point of value K under the self test mode. Moreover, if the value of the sixth analog input voltage becomes slightly larger, then the sixth analog input voltage is transformed into a digital signal of value K, whereas if the value of the sixth analog input voltage becomes slightly smaller, then the sixth analog input voltage is transformed into a digital signal of value K−1. Since the value of K ranges from 0 to $2^{N/2}-1$, all possible values of K are tested by the aforementioned method respectively so that the INL error performance of all the possible values of K is derived, and the accuracy of the present invention analog-to-digital converter 200 under the self test mode is assured. Note that the accuracies of the first digital-to-analog converter 211, the third digital-to-analog converter 215, and the comparator 203 are (N+1) least significant bits, all the three elements processing N bits a time. If the accuracies of all the three elements are assured to be N least significant bits for INL error under the self test mode, the accuracy of the analog-to-digital converter 200 can also be assured to be N least significant bits for INL error under the normal mode.

Note that the measure of FIG. 8 in the present invention is not limited by FIG. 8. The accuracies of all the three elements may also be confirmed by testing part of the nodes in the "DAC input code" side in FIG. 8. It represents that taking (N/2) bits in the "DAC input code" side is not a unique option, and so does the "ADC output code" side. L1 bits may also be taken at the "DAC input code" side, and L1 is an integer less than N/2. L2 bits may also be taken at the "ADC input code" side, and L2 is also an integer less than N/2. The choices of the values of L1 and L2 are optional according to requirements, and the accuracies of all the three elements are not significantly affected by appropriate choices of the values of L1 and L2.

Figure 9:
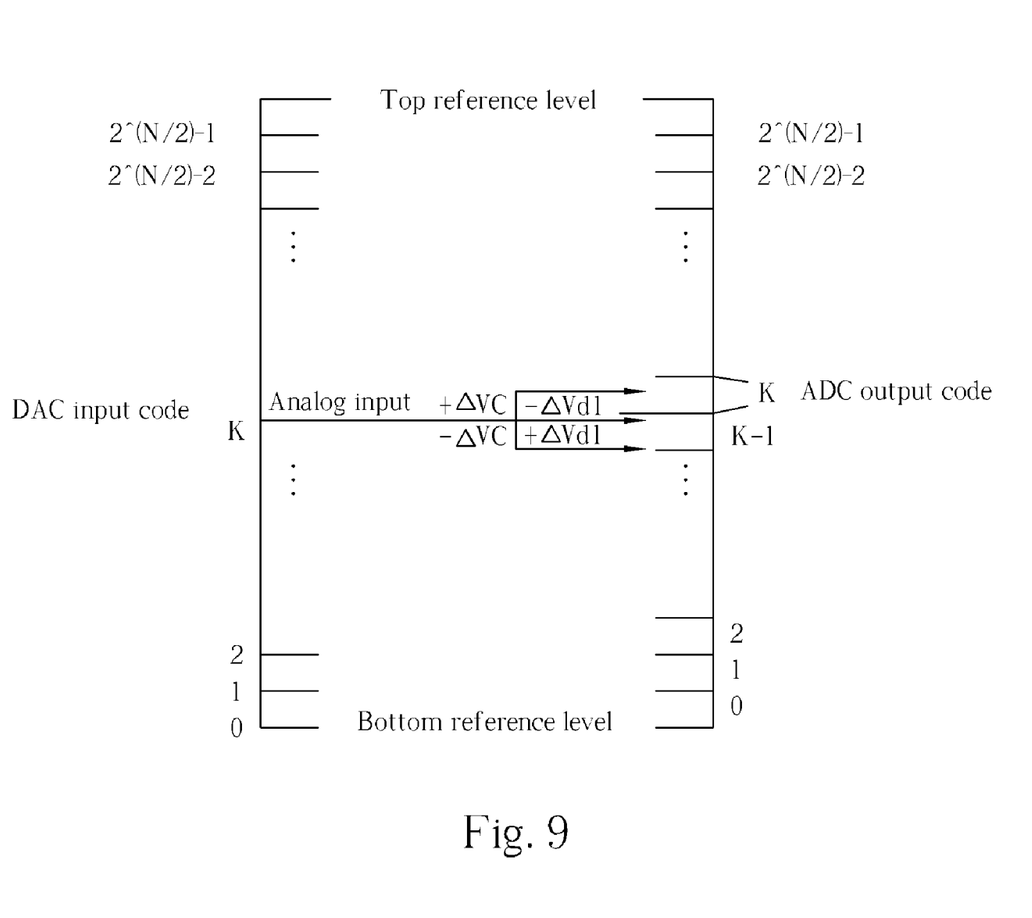
FIG. 9 is a graph showing the effect of transforming an analog input voltage into a digital signal under the self test mode of the present invention analog-to-digital converter and under an non-ideal situation.

Please refer to FIG. 9, which is a graph showing the effect of transforming an analog input voltage into a digital signal under the self test mode of the present invention analog-to-digital converter 200 and under an non-ideal situation. As shown in FIG. 9 and following FIG. 8, if the value K of the sixth analog input voltage increases ΔVd1 or deceases ΔVd1 wherein ΔVd1 is an offset error of the sixth analog input voltage, the present invention analog-to-digital converter 200 compensates for the sixth analog input voltage with a compensating voltage ΔVc or −ΔVc wherein the value of the compensating voltage ΔVc is derived during the self test mode. Thus the offset error ΔVd1 of the sixth analog input voltage is compensated so that during the self test mode, the analog input voltage K+ΔVd1 results in a digital signal of value K whereas the analog input voltage K−ΔVd1 results in a digital signal of value K−1 as the sixth analog input voltage under the ideal situation of FIG. 8. Since the offset error ΔVd1 is compensated by the compensating voltage ΔVc, it represents that an INL error of the present invention analog-to-digital converter 200 is smaller than the compensating voltage ΔVc, and the present invention analog-to-digital converter 200 is thus capable of being prevented from such INL errors.

The present invention analog-to-digital converter 200 is capable of performing BIST while the prior art analog-to-digital converter 100 is not. Since the present invention analog-to-digital converter 200 is capable of performing BIST, a testing table is no longer necessary for testing offset errors of the present invention analog-to-digital converter 200, and the size of the chip is not necessary to be increased. Moreover, an analog testing table does not need to be used, and the time-consuming tests of the nonlinearity errors can be eliminated.

By deriving offset errors with a fine-tuning procedure, equation (1) is feasible, and the accuracy of the present invention digital-to-analog converter 200 is thus assured in the self test mode. Since only the latter-half bits of an analog input voltage is modulated, an analog voltage represented by the latter-half bits must be smaller than the offset error so that the transformation of an analog input voltage is not affected by the offset error of the analog input voltage.

By the control logics of the present invention analog-to-digital converter 200 co-operating with other elements of the present invention analog-to-digital converter 200, a simple logic testing table can be used to predicting an INL error of the present invention analog-to-digital converter 200 with the recorded offset errors during the self test mode. Therefore, the ramp generator of the aforementioned built-in self test circuit is not necessary utilized for detecting nonlinearity errors and the space for the ramp generator is thus saved. The utilization of the simple logic testing table also makes the analog-to-digital converter of the present invention quicker than the prior art analog-to-digital converter utilizing the ramp generator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter comprising:
   a successive-approximation register(SAR);
   a comparator having an output coupled to a first input of the successive-approximation register;
   a first switch coupled to a first input of the comparator and an analog-ground source;
   a second switch coupled to a second input of the comparator and the analog-ground source;
   a first digital-to-analog converter having a first input coupled to a first output of the successive-approximation register, and a second input coupled to a second output of the successive-approximation register;
   a second digital-to-analog converter having an output coupled to the first input of the comparator;
   a third digital-to-analog converter having a first input coupled to the second output of the successive-approximation register, and a second input coupled to a third output of the successive-approximation register;
   a third switch coupled to a first reference voltage source, a first output of the first digital-to-analog converter, and a third input of the third digital-to-analog converter;
   a fourth switch coupled to a second reference voltage source, a second output of the first digital-to-analog converter, and a fourth input of the third digital-to-analog converter;
   a fifth switch coupled to an output of the third digital-to-analog converter, and the second input of the comparator; and
   a sixth switch coupled to the second output of the first digital-to-analog converter, the second reference voltage source, an analog input source, and the fifth switch.

2. The converter of claim 1 wherein the first digital-to-analog converter has a third input coupled to the first reference voltage source.

3. The converter of claim 1 wherein the first digital-to-analog converter has a fourth input coupled to the second reference voltage source.

4. The converter of claim 1 wherein the first digital-to-analog converter has a third output coupled to a third input of the second digital-to-analog converter, a fourth output coupled to a fourth input of the second digital-to-analog converter, and a fifth output coupled to a fifth input of the second digital-to-analog converter for outputting an average voltage of a voltage output by the third output of the first digital-to-analog converter and a voltage output by the fourth output of the first digital-to-analog converter.

5. The converter of claim 1 wherein the successive approximation register further comprises a second input for receiving a test voltage for controlling an operation mode of the successive approximation register, a third input for receiving a control signal for controlling active statuses of capacitors inside the first digital-to-analog converter, a fourth output for outputting an upper-bound output signal, and a fifth output for outputting a lower-bound output signal.

6. The method of claim 1 further comprising testing K output bits with S input bits, wherein the first, the second, and the third digital-to-analog converters are designed to process N bits a time, S, K, and N being integers; wherein the sum of S and K is less than N.

7. The method of claim 6 wherein S and K equal to N/2 respectively.

* * * * *